United States Patent [19]
Barrett, Jr. et al.

[11] Patent Number: 5,644,743
[45] Date of Patent: Jul. 1, 1997

[54] HYBRID ANALOG-DIGITAL PHASE ERROR DETECTOR

[75] Inventors: Raymond Louis Barrett, Jr., Ft. Lauderdale; Barry W. Herold, Boca Raton; Grazyna Anna Pajunen, Delray Beach; Walter L. Davis, Parkland, all of Fla.

[73] Assignee: Motorola, Inc., Schaumburg, Ill.

[21] Appl. No.: 567,387

[22] Filed: Dec. 4, 1995

[51] Int. Cl.$^6$ .................................................. H03D 3/24
[52] U.S. Cl. ..................... 375/375; 375/376; 327/159; 331/11; 331/25
[58] Field of Search ......................... 375/371, 373, 375/375, 376, 327, 328, 344; 327/7, 12, 155, 156, 160, 215, 159; 331/17, 8, 25, 16, 1 R, 10, 11; 326/147, 150

[56] References Cited

U.S. PATENT DOCUMENTS

| | | | |
|---|---|---|---|
| 3,878,334 | 4/1975 | Halpern | 375/375 |
| 4,167,711 | 9/1979 | Smoot | 331/17 |
| 4,803,705 | 2/1989 | Gillingham et al. | 375/376 |
| 4,901,026 | 2/1990 | Phillips et al. | 331/25 |
| 5,430,772 | 7/1995 | Lee et al. | 375/376 |
| 5,506,875 | 4/1996 | Nuckolls et al. | 375/375 |
| 5,525,935 | 6/1996 | Joo et al. | 331/17 |

OTHER PUBLICATIONS

"Analog VLSI & Neural Systems" by Carver Mead, pp. 67–82, 1989, U.S.A.

*Primary Examiner*—Stephen Chin
*Assistant Examiner*—Don Vo
*Attorney, Agent, or Firm*—Kelly A. Gardner

[57] ABSTRACT

A hybrid analog-digital phase error detector (107) is utilized for detecting a phase error between first and second clock signals (132, 104). Digital and analog phase error detectors (108, 116) are connected to the first and second clock signals (132, 104), and are utilized for producing digital and analog phase error values (110, 118). The digital and analog controllers (112, 120) connected to the digital and analog phase error detectors (108, 116) execute digital and analog control algorithms based on the digital and analog phase error values (110, 118) to produce digital and analog control signals (114, 122). A summer (124) connected to the outputs of the digital and analog controllers (112, 120) combines the analog control signal (122) and the digital control signal (114) to produce a composite control signal (126) representing the phase error.

18 Claims, 8 Drawing Sheets

HYBRID ANALOG-DIGITAL PHASE ERROR DETECTOR

RELATED APPLICATIONS

U.S. patent application Ser. No. 08/523,665 filed Sep. 5, 1995 by Barrett et al. entitled "Method And Apparatus for Determining an Instantaneous Phase Difference Between Two Signals".

U.S. patent application Ser. No. 08/538,930 filed Oct. 4, 1995 by Barrett et al., entitled "Apparatus for Performing Discrete-Time Analog Queuing and Computing in a Communication System".

U.S. Pat. No. 5,576,664 by Herold et al., entitled "Discrete Time Digital Phase Locked Loop".

FIELD OF THE INVENTION

This invention relates in general to phase error detectors, and more specifically to a hybrid analog-digital phase error detector.

BACKGROUND OF THE INVENTION

Analog phase error detectors of various types have been used in analog phase lock loops for many years. More recently, digital phase error detectors have come into use in digital phase lock loops. The latter have provided the advantages of repeatability and sealability often associated with digital hardware. Digital phase error detectors, however, also have a disadvantage in that they are subject to quantization error, which generates quantization noise in the phase lock loop signals.

Analog phase error detectors and analog phase lock loops are not subject to quantization error and thus do not generate quantization noise. Unfortunately, they lack the repeatability and sealability provided by digital phase error detectors and digital phase lock loops. Analog phase error detectors and analog phase lock loops generally have required precision component values, which have needed to be adjusted depending upon the frequency of operation.

Thus, what is needed is a phase error detector and a phase lock loop that can provide the advantages of both the analog and digital domains, without including the disadvantages of either domain. A phase error detector and a phase lock loop are needed that can provide the repeatability and scalability associated with the digital domain, with the freedom from quantization error and quantization noise associated with the analog domain.

SUMMARY OF THE INVENTION

An aspect of the present invention is a hybrid analog-digital phase error detector for detecting a phase error between first and second clock signals. The hybrid analog-digital phase error detector comprises an analog phase error detector coupled to the first and second clock signals for generating an analog phase error signal starting at a first selected transition of the second clock signal and ending at a first selected transition of the first clock signal. The hybrid analog-digital phase error detector also includes a digital phase error detector coupled to the first and second clock signals for generating a digital phase error value starting at a second selected transition of the second clock signal and ending at a second selected transition of the first clock signal, and a digital controller coupled to the digital phase error detector for executing a digital control algorithm based on the digital phase error value to produce a digitally derived control signal. The hybrid analog-digital phase error detector further includes an analog controller coupled to the analog phase error detector for executing an analog control algorithm based on the analog phase error value to produce an analog control signal, and a summer coupled to the digital controller and coupled to the analog controller for combining the analog control signal and the digitally derived control signal to produce a composite control signal representing the phase error.

A second aspect of the present invention is a phase lock loop. The phase lock loop comprises a controlled oscillator coupled to a composite control signal for generating a first clock signal responsive to the composite control signal, and a hybrid analog-digital phase error detector for detecting a phase error between the first clock signal and a second clock signal. The hybrid analog-digital phase error detector comprises an analog phase error detector coupled to the first and second clock signals for generating an analog phase error signal starting at a first selected transition of the second clock signal and ending at a first selected transition of the first clock signal, and a digital phase error detector coupled to the first and second clock signals for generating a digital phase error value starting at a second selected transition of the second clock signal and ending at a second selected transition of the first clock signal. The hybrid analog-digital phase error detector also includes a digital controller coupled to the digital phase error detector for executing a digital control algorithm based on the digital phase error value to produce a digitally derived control signal, and an analog controller coupled to the analog phase error detector for executing an analog control algorithm based on the analog phase error value to produce an analog control signal. The hybrid analog-digital phase error detector further includes a summer coupled to the digital controller and coupled to the analog controller for combining the analog control signal and the digitally derived control signal to produce a composite control signal representing the phase error.

A third aspect of the present invention is a communication receiver. The communication receiver comprises an antenna for intercepting a radio signal including a message, a receiver element coupled to the antenna for demodulating the message, a processor coupled to the receiver element for processing the message, a user control coupled to the processor for providing control of the communication receiver by a user, and a display coupled to the processor for displaying the message. The receiver element includes a reference oscillator for generating a second clock signal, and a phase lock loop. The phase lock loop comprises a controlled oscillator coupled to a composite control signal for generating a first clock signal responsive to the composite control signal, and a hybrid analog-digital phase error detector for detecting a phase error between the first clock signal and the second clock signal. The hybrid analog-digital phase error detector comprises an analog phase error detector coupled to the first and second clock signals for generating an analog phase error signal starting at a first selected transition of the second clock signal and ending at a first selected transition of the first clock signal, and a digital phase error detector coupled to the first and second clock signals for generating a digital phase error value starting at a second selected transition of the second clock signal and ending at a second selected transition of the first clock signal. The hybrid analog-digital phase error detector also includes digital controller coupled to the digital phase error detector for executing a digital control algorithm based on the digital phase error value to produce a digitally derived control signal, and an analog controller coupled to the analog phase error detector for executing an analog control algorithm based on the analog phase error value to produce an analog control signal. The hybrid analog-digital phase error detector further includes a summer coupled to the digital controller and coupled to the analog controller for combining the analog control signal and the digitally derived control signal to produce a composite control signal representing the phase error.

DESCRIPTION OF THE PREFERRED EMBODIMENT

Figure 1:
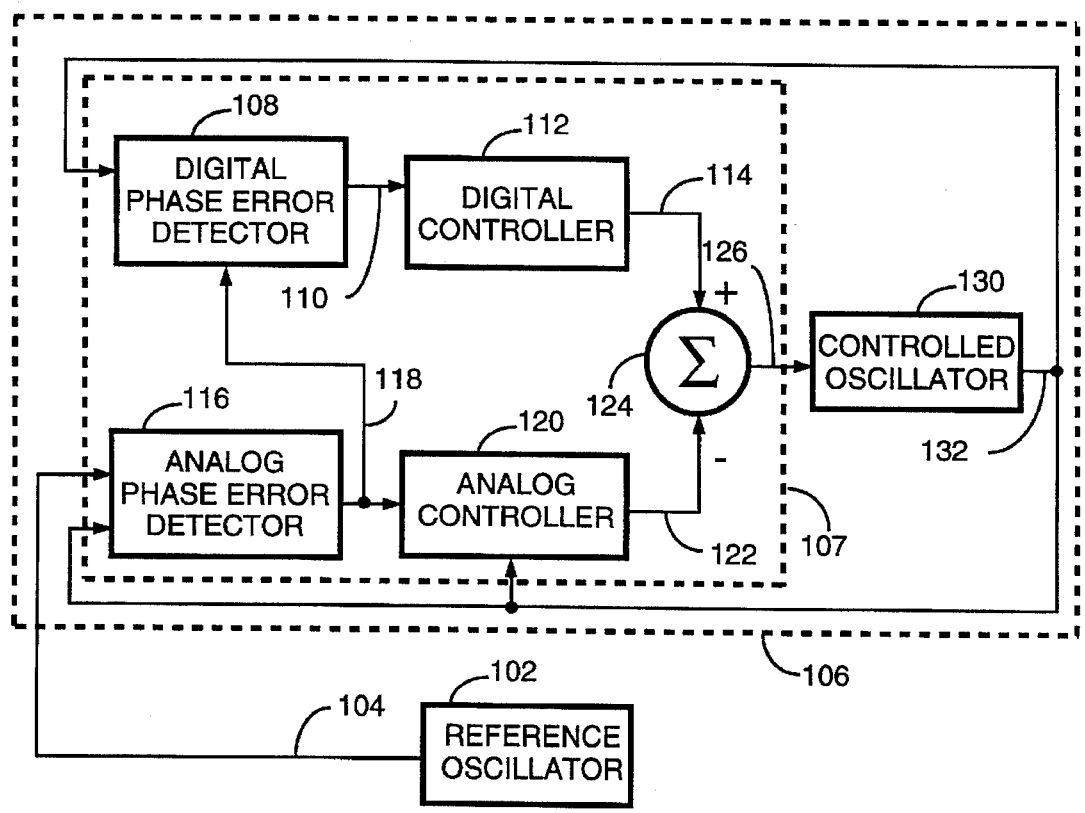
FIG. 1 is an electrical block diagram of the elements of a synthesizer in accordance with the preferred embodiment of the present invention.

FIG. 1 is an electrical block diagram of the elements of a synthesizer 100 in accordance with the preferred embodiment of the present invention. The synthesizer 100 comprises a reference oscillator 102 and a phase lock loop (PLL) 106. The reference oscillator 102 preferably utilizes a conventional crystal oscillator for generating a second clock signal 104.

The PLL 106 comprises a controlled oscillator 130, and a hybrid analog-digital phase error detector 107. The controlled oscillator 130 is coupled to a composite control signal 126 sourced by the hybrid analog-digital phase error detector 107 for generating a first clock signal 132 responsive to the composite control signal 126.

The hybrid analog-digital phase error detector 107 is utilized for detecting a phase error between the first clock signal 132 and the second clock signal 104. The hybrid analog-digital phase error detector 107 comprises a digital phase error detector 108, an analog phase error detector 116, a digital controller 112, an analog controller 120, and a summer 124. The digital phase error detector 108 is coupled to the first clock signal 132 and coupled to an analog phase error signal 118, sourced by the analog phase error detector 116, for producing a digital phase error value 110 corresponding to a selected transition of the analog phase error signal 118. The digital controller 112 is coupled to the digital phase error detector 108 for executing a digital control algorithm based on the digital phase error value 110 to produce a digitally derived control signal 114 in an analog format. The digital control algorithm is preferably a discrete-time lead-lag filter conforming to the transfer function $$H(z) = \frac{17 - 15z^{-1}}{2}.$$

The analog phase error detector 116 is coupled to the first and second clock signals 132, 104 for generating the analog phase error signal 118 having a width proportional to a time between a selected transition of the second clock signal 104 and a selected transition of the first clock signal 132. The analog controller 120 is coupled to the analog phase error detector 116 and coupled to the first clock signal 132 for executing an analog control algorithm based on the analog phase error signal 118 to produce an analog control signal 122. The analog control algorithm is preferably implemented by a discrete-time analog lead-lag filter conforming to the transfer function $$H(z) = \frac{17 - 15z^{-1}}{2}.$$

The summer 124 is an analog summer. The summer 124 is coupled to the digital controller 112 and coupled to the analog controller 120 for subtracting the analog control signal 122 from the digitally derived control signal 114 to produce the composite control signal 126 representing the phase error. It will be appreciated that the digitally derived control signal 114 and the analog control signal 122 have equal gains with respect to phase error, resulting in a linear composite control signal 126.

Figure 2:
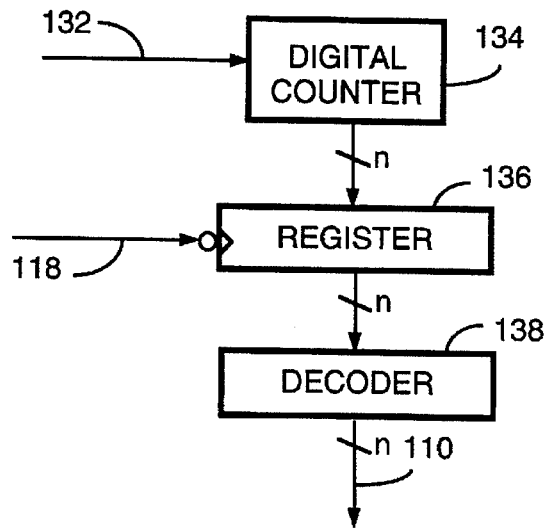
FIG. 2 is an electrical block diagram of a digital phase error detector in accordance with the preferred embodiment of the present invention.

FIG. 2 is an electrical block diagram of the digital phase error detector 108 in accordance with the preferred embodiment of the present invention. The digital phase error detector 108 comprises a digital counter 134, a conventional active-low edge-triggered register 136, and a decoder 138. The digital counter 134 is coupled to the first clock signal 132 for counting the clock cycles of the controlled oscillator 130. The digital counter 134 comprises K sequential states, where K is an integer value equal to a first frequency of the first clock signal 132 divided by a second frequency of the second clock signal 104.

The digital counter 134 is preferably implemented as a combination of a conventional linear binary counter and a Johnson Counter, well-known to one of ordinary skill in the art. It will be appreciated that, alternatively, the digital counter 134 can be in its entirety a conventional linear binary counter or a Johnson counter. A desired power consumption level and a desired complexity of the decoder 138 determine the appropriate counter architecture.

The register 136 is coupled to the digital counter 134 and coupled to the analog phase error signal 118 for storing a count value from the digital counter 134 to produce the digital phase error value 110. The register 136 records a count held by the digital counter 134 concurrent with a selected transition of the analog phase error signal 118. The concurrent event of recording the count held by the digital counter 134 results in the recording of an instantaneous phase sample.

The decoder 138 is introduced to decode the data sequence generated by the digital counter 134. The decoder 138 is implemented with conventional combinational techniques which translate the data sequence to a linear sequence as required for the operation of the digital controller 112. Once the recorded signal has been decoded, the decoder 138 generates the digital phase error value 110. Further information concerning the operation and theory of a digital phase error detector similar to the digital phase error detector 108 can be found in U.S. patent application Ser. No. 08/523,665 filed Sep. 5, 1995 by Barrett et al., entitled "Method And Apparatus for Determining an Instantaneous Phase Difference Between Two Signals", which application is hereby incorporated herein by reference.

Figure 3:
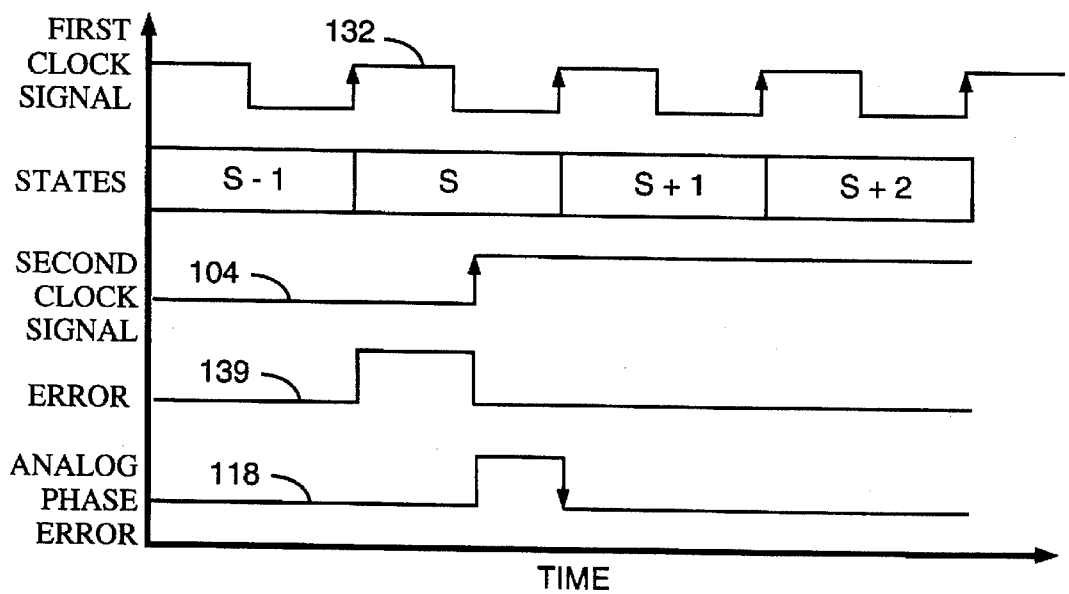
FIG. 3 is a timing diagram depicting the operation of a hybrid analog-digital phase error detector in accordance with the preferred embodiment of the present invention.

FIG. 3 is a timing diagram depicting the operation of the hybrid analog-digital phase error detector 107 in accordance with the preferred embodiment of the present invention. The timing diagram shows a succession of states from the digital counter 134, the first and second clock signals 132, 104, a phase error signal labeled Error 139, and the analog phase error signal 118.

The rising edge of the second clock signal 104 is shown occurring approximately at the center of the state labeled S, which represents the exact phase error only immediately after the state has been entered. The signal labeled Error 139 represents the amount of quantization error that would occur if the state of the digital counter 134 were recorded concurrent with the rising edge of the second clock signal 104. The Error 139 is relative to the start of state S. The phase error accumulates during state S up until state S+1 begins.

In accordance with the present invention, the state of the digital counter 134 is not recorded until a new state (S+1 in this example) occurs. The delay in recording, results in a quantization error represented by the analog phase error signal 118. This signal is initiated by the rising edge of the second clock signal 104, and terminated by the occurrence of a transition to a new state (S+1 in this example) coincident with the rising edge of the first clock signal 132. The value of the captured state, the digital phase error value 110, is transferred on the falling edge of the analog phase error signal 118 to the digital controller 112, which executes the digital control algorithm described above. The analog phase error signal 118, is similarly available to the analog controller 120 which executes the analog control algorithm discussed above.

Since the control signals 114, 122 derived from the digital and analog controllers 112, 120 are linear, the principle of superposition can be applied. Performing simple subtraction on these signals results in the composite control signal 126. By subtracting the analog control signal 122 from the digitally derived control signal 114 the quantization error is substantially removed. This strategy advantageously allows use of the repeatability and scalability of the digital controller 112 for correcting large phase errors, and the high resolution of the analog controller 120 to deal with small corrections near the correct operating point, thereby minimizing quantization noise.

Figure 4:
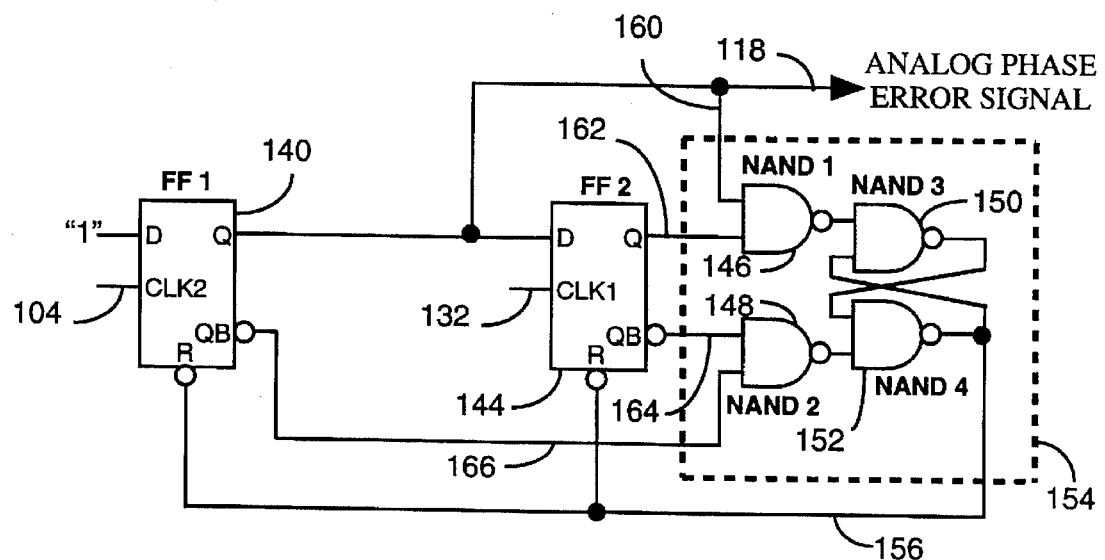
FIG. 4 is an electrical block diagram of an analog phase error detector in accordance with the preferred embodiment of the present invention.

FIG. 4 is an electrical block diagram of the analog phase error detector 116 in accordance with the preferred embodiment of the present invention. The analog phase error detector 116 is implemented with digital hardware. The circuit is a modified version of the Phase-Frequency Detector (PFD) used in a conventional Sink-Source Float (SSF) phase detector. The circuit comprises a reset generator 154, a first flip-flop (FF1) 140, and a second flip-flop (FF2) 144.

The reset generator comprises a first NAND gate (NAND1) 146, a second NAND gate (NAND2) 148, a third NAND gate (NAND3) 150, and a fourth NAND gate (NAND4) 152. NANDs (1 through 4) 146, 148, 150, 152 are two input conventional NAND gates. The inputs of NAND1 146 form the first and second inputs 160, 162 of the reset generator 154. The inputs of NAND2 148 form the third and fourth inputs 164, 166 of the reset generator 154. The inputs of NAND3 150 are coupled, respectively, to an output of NAND1 146 and an output of NAND4 152. The inputs of NAND4 152 are coupled respectively, to an output of NAND3 150 and an output of NAND2 148. The output of NAND4 152 forms the reset signal 156 of the reset generator 154.

FF1 140 has a clock input coupled to the second clock signal 104, a data input coupled to a binary "1" signal, a non-inverting output coupled to a data input of FF2 144 and coupled to the first input 160 of the reset generator 154. FF1 140 further has an inverting output coupled to the fourth input 166 of the reset generator 154, and an inverted reset input coupled to the reset signal 156 of the reset generator 154. The non-inverting output of FF1 140 generates a rectangular pulse having a width proportional to the time between the selected transition (rising edge) of the second clock signal 104 and the selected transition (rising edge) of the first clock signal 132. This rectangular pulse represents the analog phase error signal 118.

FF2 144 has a clock input coupled to the first clock signal 132, a non-inverting output coupled to the second input 162 of the reset generator 154, an inverting output coupled to the third input 164 of the reset generator 154, and an inverted reset input coupled to the reset signal 156 of the reset generator 154.

The reset generator 154 initiates a reset pulse whenever both Flip-Flops 140, 144 are set, but does not terminate until both are reset. Starting from the initial condition of both Flip-Flops reset, the rising edge of the second clock signal 104 causes FF1 140 to enter the set condition, initiating the beginning of the analog phase error signal 118. The next rising edge of the first clock signal 132 causes FF2 144 to enter the set condition. Satisfying the logic conditions on NAND1 146 from the outputs of both Flip-Flops causes its output to go to a logic low, the output of NAND3 150 to go high, the output of NAND4 152 to go low, which consequently causes the reset signal 156 to go low.

The low output of NAND4 152 causes a non-critical race to occur between the outputs of both Flip-Flops, removing the conditions which initiated the reset from NAND1 146 as soon as either one resets, but not the reset operation itself due to the latching operation of NAND3 150 and NAND4 152. When both Flip-Flops are reset, the conditions are correct for the evaluation of NAND2 148 to set the reset generator 154, thereby terminating the reset sequence. The only meta-stable condition of consequence in this implementation occurs if FF1 140 is set during a time soon followed by the first clock signal 132 so as to violate the set-up requirements of FF2 144. The operation of the circuit, however, makes the outcome irrelevant, either terminating in a very short time, or that time plus an entire state interval until the next edge of the first clock signal 132.

Note that the termination of the analog phase error signal 118 occurs on the return of FF1 140 to the reset condition, which occurs only after the initiation of the reset sequence, which in turn occurs only after the entry of FF2 144 into the set condition, which in turn occurs only after the first clock signal 132 has occurred. This chain of delays ensures that the falling edge of the analog phase error signal 118 is a suitable signal to capture the value of the digital counter 134 following the first clock signal 132. This behavior relaxes the requirements on the digital counter 134 somewhat, and allows multiple bits to change between states, although it is still desirable to minimize the number of bit changes between states for power consumption reasons.

Care must be taken with the combination of parallel control algorithms (i.e., the analog and digital control algorithms) to prevent phase differences in the two control paths from canceling the control effort over some band of frequencies, and resulting in low loop gain and high noise at that set of sidebands. Careful design and the small control effort required of the analog path makes this not too difficult a problem to deal with. Further, as long as the design centers the operating point in the middle of some state, the digitally derived control signal 114 generated by the digital controller 112 can be reduced to a constant with the rest of the dynamic effort provided by the analog control signal 122 generated by the analog controller 120.

Figure 5:
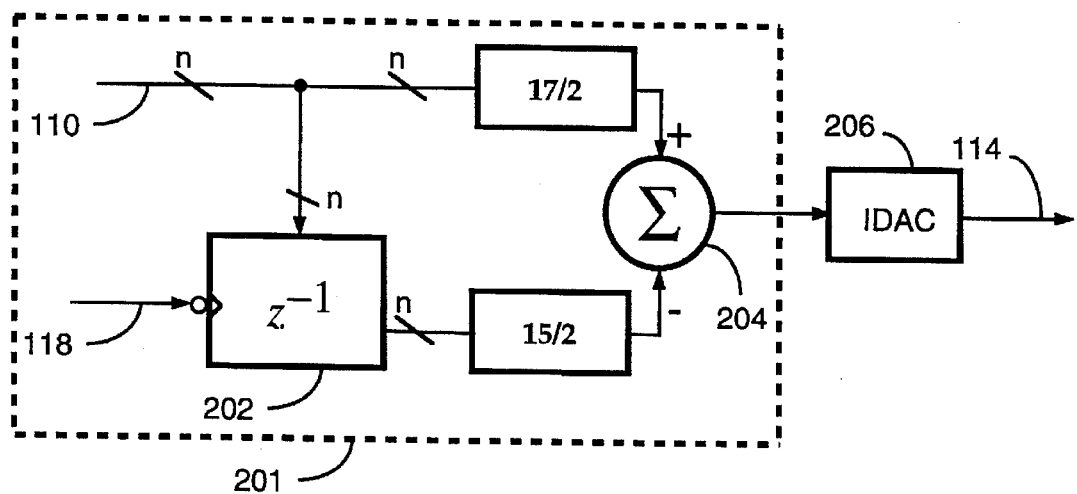
FIG. 5 is an electrical block diagram of a digital controller in accordance with the preferred embodiment of the present invention.

FIG. 5 is an electrical block diagram of the digital controller 112 in accordance with the preferred embodiment of the present invention. The digital controller 112 comprises a discrete-time lead-lag filter 201, and a conventional current-based digital to analog converter (IDAC) 206. Recalling, the digital control algorithm is preferably the discrete-time lead-lag filter 201 conforming to the transfer function $$H(z) = \frac{17 - 15z^{-1}}{2}.$$

The discrete-time lead-lag filter 201 includes a register 202, and a summer 204. The register 202 is a conventional active-low edge-triggered register conforming to the function $$z^{-1},$$

thereby generating a delayed digital signal.

The inputs of the register 202 are coupled to the analog phase error signal 118, and the digital phase error value 110. The register 202 preferably loads the digital phase error value 110 at the falling edge of the analog phase error signal 118. The delayed digital signal of the register 202 is scaled by 15/2 and is coupled to an inverting input of the summer 204. The summer 204 is further coupled to the digital phase error value 110, scaled by 17/2. The summer 204 is preferably a conventional digital subtracter, which subtracts the delayed, scaled digital signal from the scaled digital phase error value 110, generating a composite digital signal which is coupled to the input of the IDAC 206. The IDAC 206 in response to the composite digital signal generates the digitally derived control signal 114 preferably in the form of an analog current.

Further information concerning the operation and theory of a digital controller similar to the digital controller 112 can be found in U.S. Pat. No. 5,576,664 by Herold et al., entitled "Discrete Time Digital Phase Locked Loop", which application is hereby incorporated herein by reference.

Figure 6:
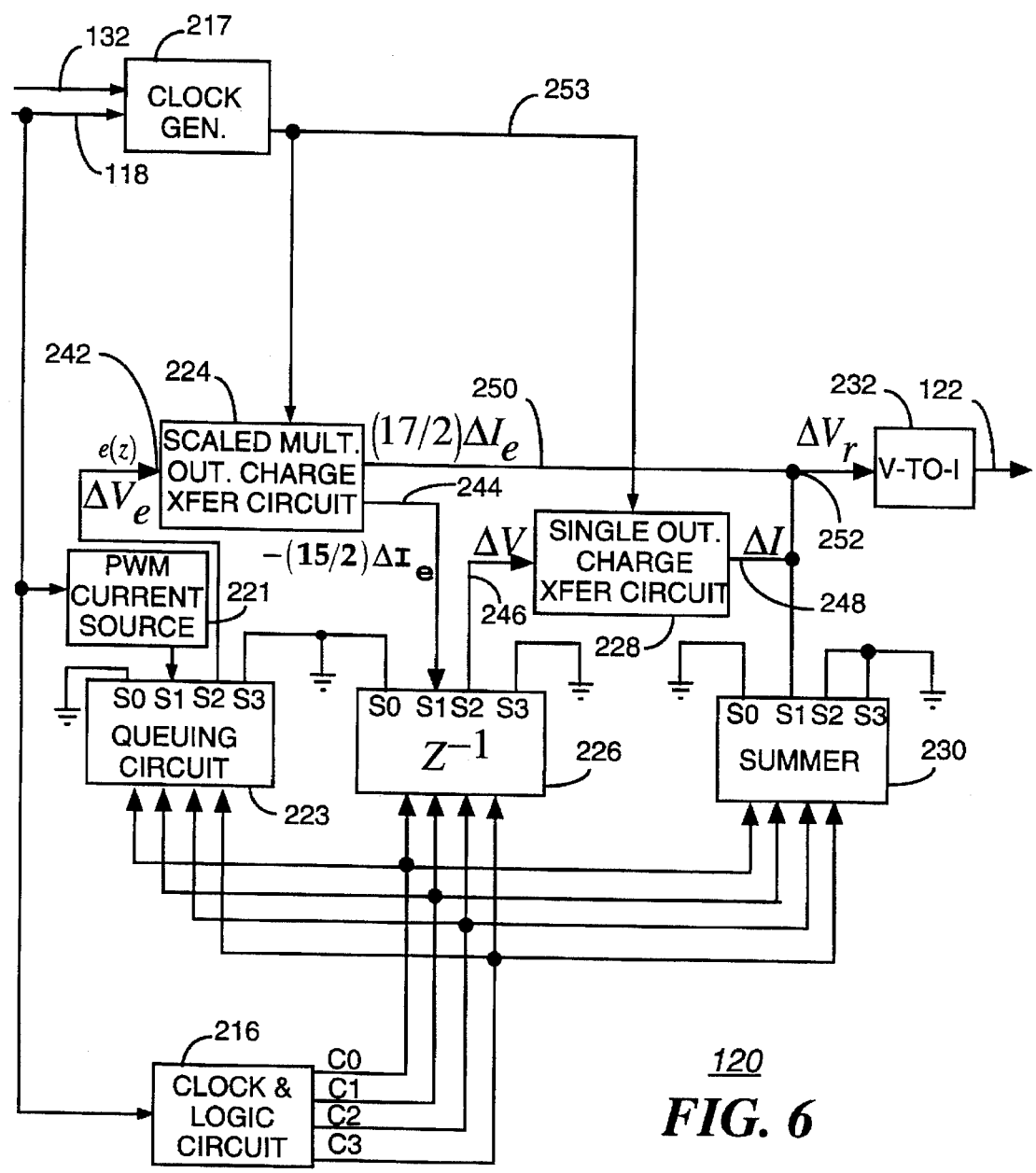
FIG. 6 is an electrical block diagram of an analog controller in accordance with the preferred embodiment of the present invention.

FIG. 6 is an electrical block diagram of the analog controller 120 in accordance with the preferred embodiment of the present invention. Once the analog phase error signal 118 has been generated, the analog controller 120 applies the discrete-time lead-lag transfer function $$H(z) = \frac{17 - 15z^{-1}}{2}.$$

To implement this function, the analog controller 120 includes a discrete-time analog queuing element (to be described below) connected in a way as to function as a pulse width modulated (PWM) current source 221, a queuing circuit 223, a scaled multiple output charge transfer circuit 224, a discrete-time analog queuing element connected in a way as to function as a single clock delay $z^{-1}$ element 226, a single output charge transfer circuit 228, a discrete-time analog queuing element connected in a way as to function as a summer 230, a clock generator 217, a clock and logic circuit 216, and a V-to-I converter 232.

The PWM current source 221 is a conventional current source digitally controlled that sources a constant current into signal line S1 of the queuing circuit 223 when activated. The charge accumulated by the queuing circuit 223 voltage signal $\Delta V_e$ or equivalently e(z). The queuing circuit 223 queues $\Delta V_e$ and later delivers it on signal line S2 to the input 242 of the scaled multiple output charge transfer circuit 224. The scaled multiple output charge transfer circuit 224 has a first output 250 coupled to a summing node 252, and a second output 244 coupled to one of the analog signal lines S1 of the single clock delay $z^{-1}$ element 226 for delivering thereto a charge proportional to the input voltage change $\Delta V_e$. The single output charge transfer circuit 228 has an input 246 coupled to one of the analog signal lines S2 of the single clock delay $z^{-1}$ element 226 for receiving therefrom an input voltage change $\Delta V$. The single output charge transfer circuit 228 also has an output 248 for providing a current pulse signal $\Delta I$ comprising a charge proportional to $\Delta V$. The current pulse signal $\Delta I$ is delivered to the summer 230 which converts the current pulse to a voltage signal that combines at the summing node 252 resulting in the signal $\Delta V_r$. The input of the V-to-I converter 232 converts the signal to a current signal, representing the analog control signal 122.

The clock generator 217 is a conventional four bit state machine which generates an enable clock 253 from the most significant state bit. The state machine comprises sixteen linear states starting at 15 and decrementing down to 0. The state machine operates from the rising-edge of the first clock signal 132. Upon arriving at state 0, the state machine remains in this state until the analog phase error signal 118 is active-high. Upon detecting that the analog phase error signal 118 is active-high, the state machine progresses from state 0 back to state 15, and decrements back to state 0 after sixteen clock cycles of the first clock signal 132, thereby repeating the cycle described. The enable clock 253, as will be described below, serves as an enable signal for both the scaled multiple output charge transfer circuit 224, and the single output charge transfer circuit 228.

The clock and logic circuit 216 is driven by the falling edge of the analog phase error signal 118. The clock and logic circuit 216 preferably utilizes a conventional Johnson Counter to produce glitchless clock outputs (C0 through C3). Only one clock bit is active-high (i.e., a binary one) at one time. The clock outputs are coupled to the queuing circuit 223, the single clock delay $z^{-1}$ element 226, and the summer 230.

The queuing circuit 223 serves the purpose of queuing the analog phase error signal 118 for delivery to the scaled multiple output charge transfer circuit 224. In implementing this function, the discrete-time analog queuing element is configured such that signal line S3 is connected to ground, signal line S2 forms the output that generates $\Delta V_e$, signal line S1 forms the input that receives the analog phase error signal 118, and signal line S0 is connected to ground. Table 1 illustrates how the analog phase error signal 118 (represented by the symbol APEV) is queued in the discrete-time analog queuing element thereby generating the voltage pulse $\Delta V_e$.

TABLE 1

Signal Sequence for the Queuing Circuit

|    | CP3  | CP2         | CP1         | CP0         |
|----|------|-------------|-------------|-------------|
| C1 | APEV | $\Delta V_e$ | G           | G           |
| C2 | $\Delta V_e$ | G    | G           | APEV        |
| C3 | G    | G           | APEV        | $\Delta V_e$ |
| C0 | G    | APEV        | $\Delta V_e$ | G           |
| C1 | APEV | $\Delta V_e$ | G           | G           |
| C2 | $\Delta V_e$ | G    | G           | APEV        |

The highlighted sections of Table 1 illustrate the sequence of events which result in a queuing sequence for the analog phase error signal 118 resulting in the output of the signal $\Delta V_e$. The columns of the table comprise CP0 through CP3 which are conventional capacitors which are used for storing charge in the discrete-time analog queuing element (as will be described later below). The rows C0 through C3, which circulate, are the clock signals generated by the clock and logic circuit 216.

When clock C1 is active, CP0 and CP1 are reset (i.e., grounded), CP2 generates the output $\Delta V_e$ from a previous cycle (where C0 was active), and CP3 is charged by the analog phase error signal 118 (APEV). At the moment that the analog phase error signal 118 goes active-low (falling edge), the clock and logic circuit 216 asserts C2. At C2 the analog phase error signal 118 which had been stored in CP3 as the voltage $\Delta V_e$ is now configured as an output (i.e., signal line S2) for generating $\Delta V_e$. The input signal S1 and the output signal S2 continue to rotate from CP0 through CP3 as shown.

The current pulse $-(15/2)\Delta I_e$ generated by the scaled multiple output charge transfer circuit 224 is coupled to the single clock delay $z^{-1}$ element 226. The single clock delay $z^{-1}$ element 226 delays the generation of the equivalent voltage pulse $\Delta V$ by one cycle of the falling-edge of the analog phase error signal 118. To accomplish this operation the analog signal lines are connected in the same manner as the queuing circuit 223. Table 2 illustrates how the current pulse $-(15/2)\Delta I_e$ is delayed by one cycle of the falling-edge of the analog phase error signal 118, thereby generating the voltage pulse $\Delta V$.

TABLE 2

Signal Sequence for Single Clock Delay Discrete-Time Analog Queuing Element

|    | CP3             | CP2             | CP1             | CP0             |
|----|-----------------|-----------------|-----------------|-----------------|
| C1 | $-(15/2)\Delta I_e$ | $\Delta V$  | G               | G               |
| C2 | $\Delta V$      | G               | G               | $-(15/2)\Delta I_e$ |
| C3 | G               | G               | $-(15/2)\Delta I_e$ | $\Delta V$  |
| C0 | G               | $-(15/2)\Delta I_e$ | $\Delta V$  | G               |
| C1 | $-(15/2)\Delta I_e$ | $\Delta V$  | G               | G               |
| C2 | $\Delta V$      | G               | G               | $-(15/2)\Delta I_e$ |

The highlighted sections of Table 2 illustrate the sequence of events which result in a single clock delayed output of the signal $-(15/2)\Delta I_e$ represented by $\Delta V$. For example, at C1, CP0 is reset (i.e., grounded). At C2, CP0 receives the pulse signal $-(15/2)\Delta I_e$ which is stored as a charge voltage $\Delta V$. One cycle later of the falling-edge of the analog phase error signal 118 when C3 is asserted, CP0 sources the output signal $\Delta V$. Note the same sequence rotates from CP0 through CP3.

The voltage pulse $\Delta V$ is coupled to the single output charge transfer circuit 228 which converts the pulse signal to an equivalent current pulse signal $\Delta I$. The current pulse signal $\Delta I$ is then combined simultaneously with the current pulse signal $(17/2)\Delta I_e$ in the summer 230 generating a resultant voltage pulse signal $\Delta V_r$. The voltage pulse signal $\Delta V_r$ is converted to a current signal by the conventional V-TO-I converter 232, which represents the analog control signal 122 of the analog controller 120. The summer 230 exchanges a charge from CP0 through CP3 as shown in Table 3.

TABLE 3

Summer

|    | CP3         | CP2         | CP1         | CP0         |
|----|-------------|-------------|-------------|-------------|
| C1 | $\Delta V_r$ | G          | G           | G           |
| C2 | G           | G           | G           | $\Delta V_r$ |
| C3 | G           | G           | $\Delta V_r$ | G          |
| C0 | G           | $\Delta V_r$ | G          | G           |
| C1 | $\Delta V_r$ | G          | G           | G           |

It will be appreciated that, alternatively, the queuing circuit 223, the single clock delay $z^{-1}$ element 226, and the summer 230 can be implemented with a two-by-two version of the discrete-time analog queuing element of FIG. 7 (described below) with two phase clocking.

Further information concerning the operation and theory of an analog controller similar to the analog controller 120 can be found in U.S. patent application Ser. No. 08/538,930 filed Oct. 4, 1995 by Barrett et al., entitled "Apparatus for Performing Discrete-Time Analog Queuing and Computing in a Communication System", which application is hereby incorporated herein by reference.

Figure 7:
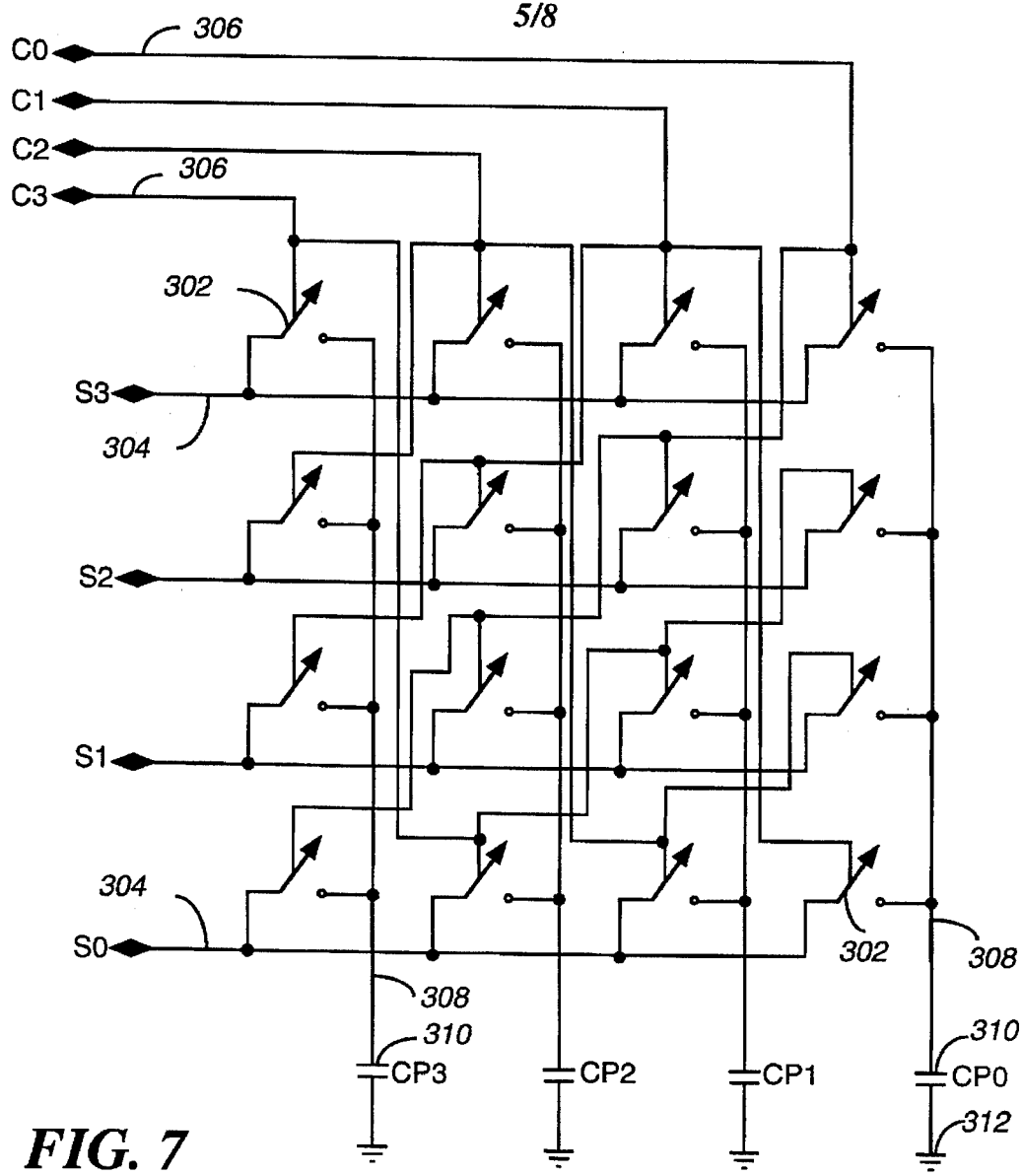
FIG. 7 is a detailed electrical block diagram of a switching matrix included in the analog controller in accordance with the preferred embodiment of the present invention.

FIG. 7 is a detailed electrical block diagram of a discrete-time analog queuing element utilized by the elements of the analog controller 120 described above in accordance with the preferred embodiment of the present invention. The discrete-time analog queuing element comprises N analog signal lines 304, wherein N is a positive integer, N analog storage lines 308, and N control lines 306. The discrete-time analog queuing element further includes $N^2$ controllable switches 302. The controllable switches 302 preferably utilize conventional transmission gate switches, similar to the Motorola MC4066 switch manufactured by Motorola, Inc. of Schaumburg, Ill. Each controllable switch 302 is coupled between one of the N analog signal lines 304 and one of the N analog storage lines 308. There are also N charge storage elements 310. Each charge storage element 310 is coupled between one of the N analog storage lines 308 and a common circuit node 312 (e.g., signal ground).

Each control line 306 is coupled to N of the $N^2$ controllable switches 302, and controls the controllable switches 302 in response to the control lines 306 being activated in a predetermined sequence. Each of the analog storage lines 308 is coupled in turn to each of the analog signal lines 304 in a sequence having a predetermined rotating order, wherein the predetermined rotating order is identical for each of the analog storage lines 308, except that the sequence corresponding to each of the analog storage lines 308 begins with a different one of the analog signal lines 304.

In this example N=4. Therefore, there are four control lines 306 (C0 through C3), four analog signal lines 304 (S0 through S3), four analog storage lines 308, sixteen controllable switches 302, and four charge storage elements 310 (CP0 through CP3). The charge storage elements 310 are preferably conventional capacitors.

Figure 8:
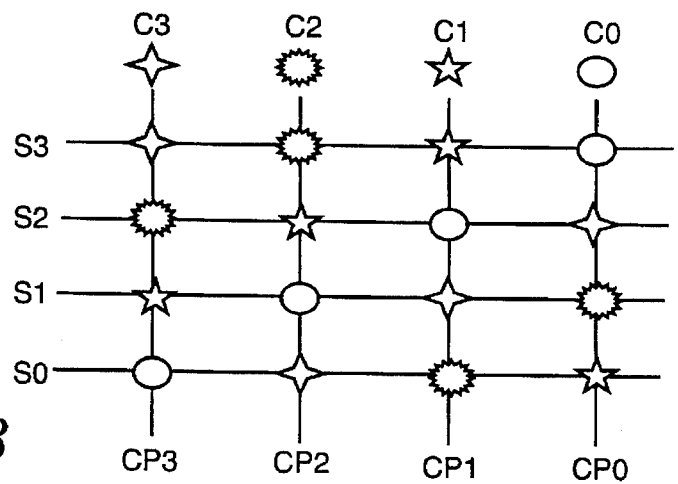
FIG. 8 is an illustration of the interconnectivity of the switching matrix in accordance with the preferred embodiment of the present invention.

FIG. 8 is an illustration of the interconnectivity of the controllable switches 302 of the switching matrix included in the discrete-time analog queuing element in accordance with the preferred embodiment of the present invention. For illustration purposes the control lines 306 have each been given a symbol. Recalling that only one control line 306 is active at one time, when control line C0 is active only the switches 302 with C0's symbol are closed. That is, S3 is connected with CP0, S2 is connected to CP1, S1 is connected with CP2, and S0 is connected with CP0. When C1 is active, S3 is connected to CP1, S2 is connected to CP2, S1 is connected to CP3, and S0 is connected to CP0. Operation in response to C2 and C3 is similar to that in response to C0 and C1.

As an example of the operation of the discrete-time analog queuing element let S0 connect to a reference circuit node, such as signal ground (G) for setting a predetermined charge and resultant voltage, e.g., zero volts, on the charge storage elements 310. In addition, let S1 connect to the signal PD, S2 connected to the signal PU, and S3 be considered an output that generates the output signal.

TABLE 4

Queuing Example

|    | CP3 | CP2 | CP1 | CP0 |
|----|-----|-----|-----|-----|
| C1 | PD  | PU  | S3  | G   |
| C2 | PU  | S3  | G   | PD  |
| C3 | S3  | G   | PD  | PU  |
| C0 | G   | PD  | PU  | S3  |
| C1 | PD  | PU  | S3  | G   |
| C2 | PU  | S3  | G   | PD  |
| C3 | S3  | G   | PD  | PU  |

Table 4 shows an example queuing sequence of the discrete-time analog queuing element. Each column represents a charge storage element in the switch matrix, while each row is a single active control line. Recall that only one control line is active at each instance of the clock controlling the clock signals of the clock and logic circuit 216. The first row shows the control signal C1 active. During this time, the PD signal is connected to CP3, the PU signal is connected to CP2, the output signal S3 is connected to CP1, and CP0 is connected to ground (i.e., reset). Similarly, when control line C2 is active CP3 is connected to the PU signal, CP2 is connected to the output signal S3, CP1 is reset, and CP0 is connected to the PD signal. Note, as highlighted, that the sequence of queuing is a reset, followed on the next control cycle by PD, followed by PU, and finally followed by S3 where the stored signal is delivered at the output node. Essentially the discrete-time analog queuing element provides a discrete-time analog queue for the signals PU and PD.

Figure 9:
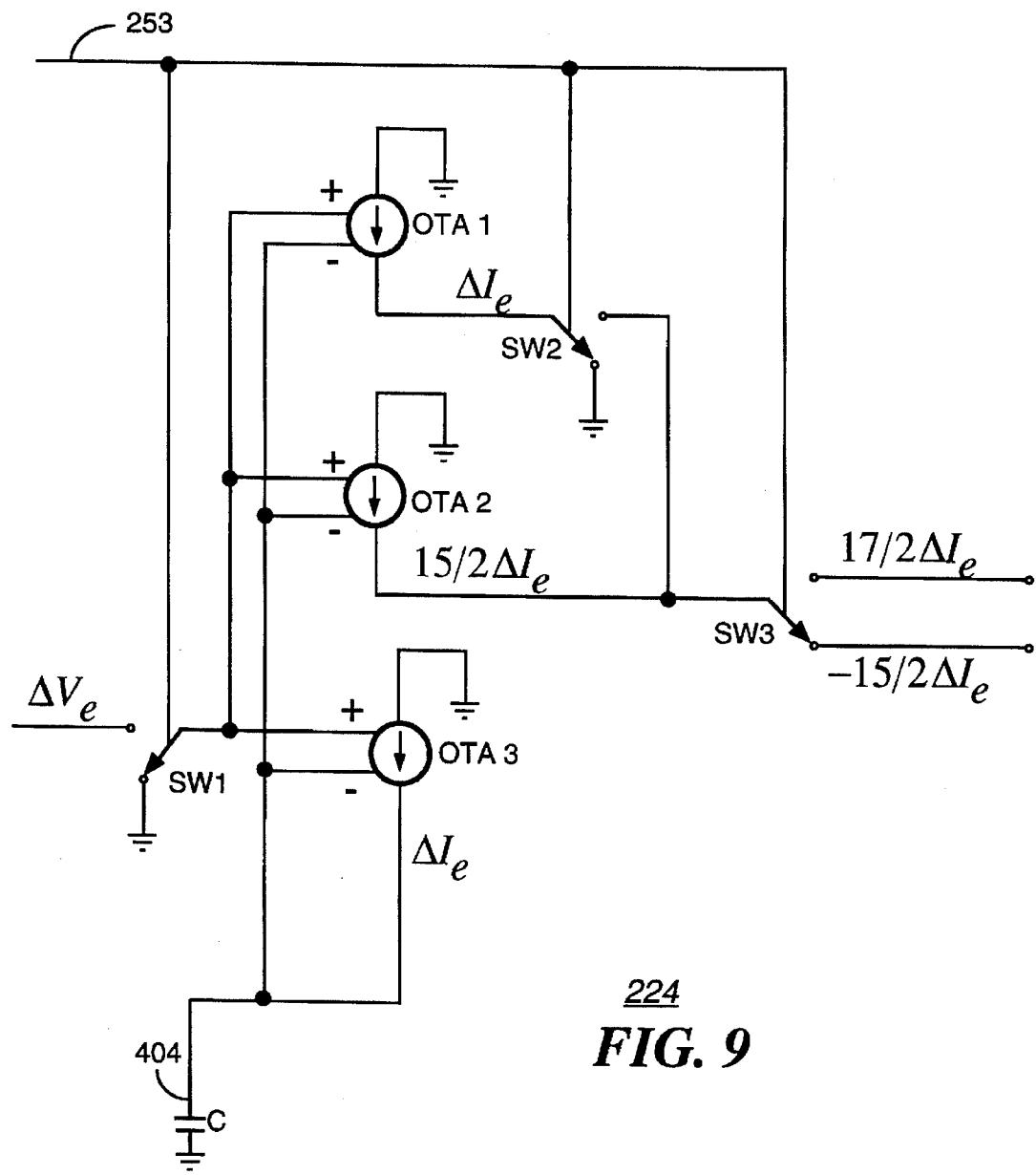
FIG. 9 is a detailed electrical block diagram of a scaled multiple output charge transfer circuit in accordance with the preferred embodiment of the present invention.

FIG. 9 is a detailed electrical block diagram of the scaled multiple output charge transfer circuit 224 in accordance with the preferred embodiment of the present invention. The scaled multiple output charge transfer circuit 224 includes three operational transconductance amplifiers (OTA 1, OTA 2 and OTA 3 shown by way of example). The OTAs are conventional transconductance circuits, such as described in "Analog VLSI and Neural Systems" by Carver Mead, pp 67–82. The scaled multiple output charge transfer circuit 224 further includes switches (SW1, SW2, and SW3 shown by way of example), which can be realized by utilizing transmission gate switches, similar to the Motorola MC4066. The scaled multiple output charge transfer circuit 224 also includes a reference charge storage element 404 (a conventional capacitor). The scaled multiple output charge transfer circuit 224 has two inputs which include the enable clock 253, and the voltage signal $\Delta V_e$, and two outputs comprising the current pulse signals $(17/2)\Delta I_e$ and $-(15/2)\Delta I_e$.

The switches shown are active-high toggle switches (i.e., they switch from the opposite position shown with a logic "1" signal). When the enable clock 254 is active-low, SW1 disconnects from the $\Delta V_e$ signal, and the positive terminals of OTAs 1–3 are grounded. Thus, any charge present on the reference charge storage element 404 is removed and grounded by OTA3. By discharging the reference charge storage element 404, the OTAs are prevented from sourcing or sinking current, thereby having no effect on the signal terminal $-(15/2)\Delta I_e$.

Upon arrival of the rising edge of the enable clock 253, the scaled multiple output charge transfer circuit 224 sources a current pulse signal of $(17/2)\Delta I_e$. This is accomplished by toggling SW1 to the $\Delta V_e$ signal position, SW2 to the $\Delta I_e$ signal position, and SW 3 to the $(17/2)\Delta I_e$ signal position. Connecting to $\Delta V_e$ charges the reference storage element by way of OTA3 to $\Delta V_e$ with the current pulse signal $\Delta I_e$. This places a voltage signal of $\Delta V_e$ on the negative terminals of each OTA. In response, OTA1, which is scaled to source a current pulse signal of $\Delta I_e$, and OTA2, which is scaled to source a current pulse signal of $15/2\Delta I_e$, simultaneously source their respective current pulse signals, which sum together at a summing node thereby generating the current pulse signal $(17/2)\Delta I_e$. In the meantime, the $-(15/2)\Delta I_e$ signal terminal is at high impedance (i.e., disconnected by SW3).

Upon arrival of the falling edge of the enable clock 253 all switches toggle back to their original positions. This in effect grounds the negative terminals of all the OTAs. Since at this instant the positive terminals of the OTAs are still at $\Delta V_e$, OTA2 sinks a current pulse signal of $-(15/2)\Delta I_e$ to ground. This current pulse signal is drawn from the signal terminal $-(15/2)\Delta I_e$ since SW3 is in its original position. A short period thereafter, the reference charge element is grounded, and the cycle repeats upon the next rising edge of the enable clock 253.

Figure 10:
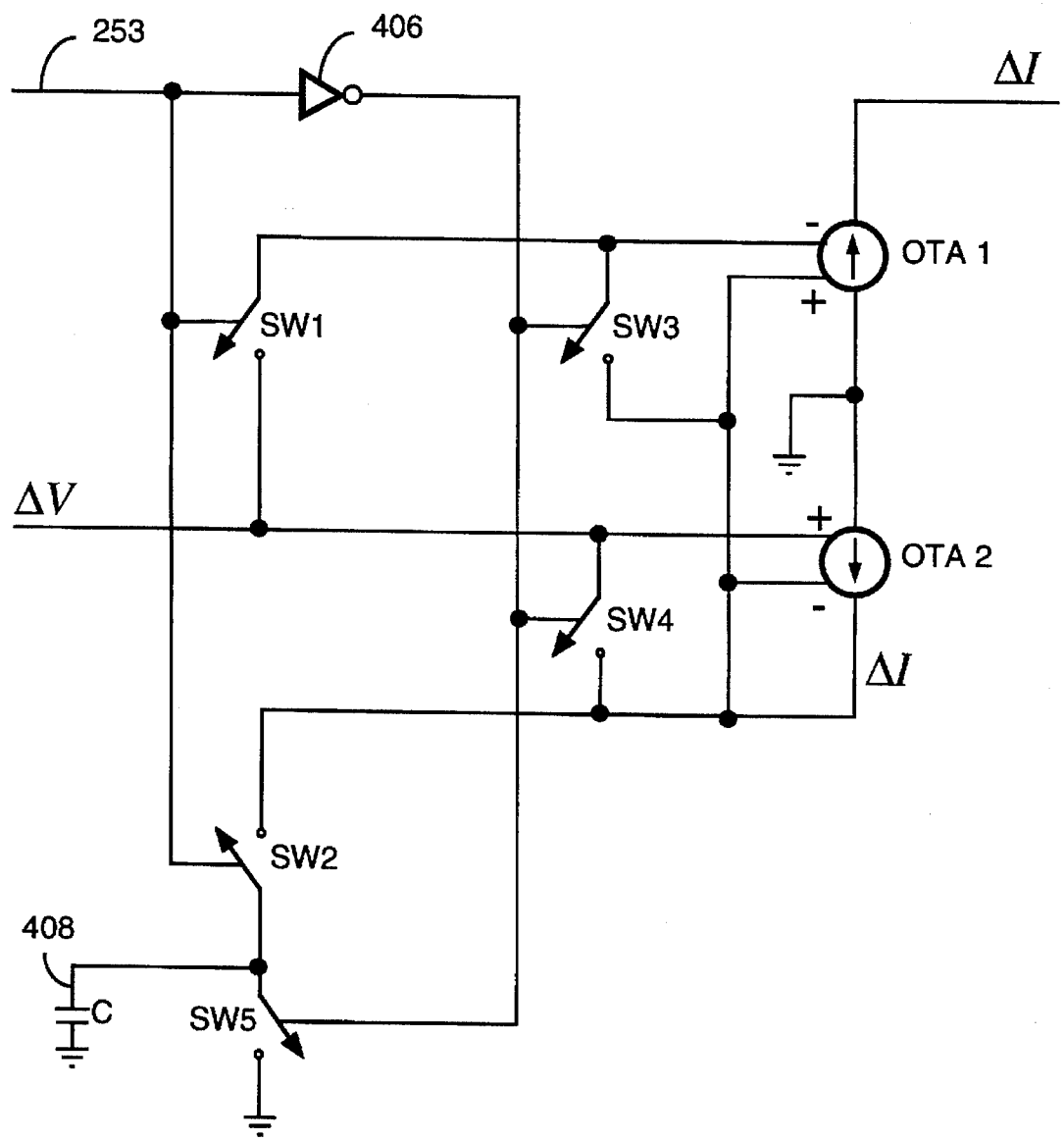
FIG. 10 is a detailed electrical block diagram of a single output charge transfer circuit in accordance with the preferred embodiment of the present invention.

FIG. 10 is a detailed electrical block diagram of the single output charge transfer circuit 228 in accordance with the preferred embodiment of the present invention. This circuit operates similar to the circuit of FIG. 9 with the exception that the circuit provides a single output and is scaled for a one to one ratio. The single output charge transfer circuit 228 includes five switches, two OTAs, a reference charge storage element 408, and a logic inverter 406. As mentioned above, the single output charge transfer circuit 228 has two inputs comprising the enable clock 253 and the voltage signal $\Delta V$, and one output comprising the current signal $\Delta I$.

The single output charge transfer circuit 228 is in the reset state when the enable clock 253 is in the low state. In this state switches SW3, SW4 and SW5 are closed while SW1 and SW2 are open. As before, the differential inputs of the OTAs are shorted, and the reference charge storage element 408 is discharged to ground. When the enable clock 253 becomes active, switches SW1 and SW2 are closed while switches SW3, SW4 and SW5 are open. At the same time that the enable clock 253 becomes active, the signal $\Delta V$ is provided at the input of the single output charge transfer circuit 228. The voltage signal $\Delta V$ is connected to the upper terminals of OTA 1 and OTA 2. OTA 2 charges the reference charge storage element 408 to the same level as $\Delta V$. Charging to $\Delta V$ requires an electric charge of $\Delta V \times c$. This charge is delivered from OTA 2 in the form of a current pulse $\Delta I$ as shown. OTA 1 operates as a current mirror which delivers the signal $\Delta I$ at the output. Once the differential terminals of OTAs 1 and 2 are at the same voltage, the current pulse ceases. Before the rising edge of the enable clock 253, the OTAs and the reference charge storage element 408 are reset as described above.

Figure 11:
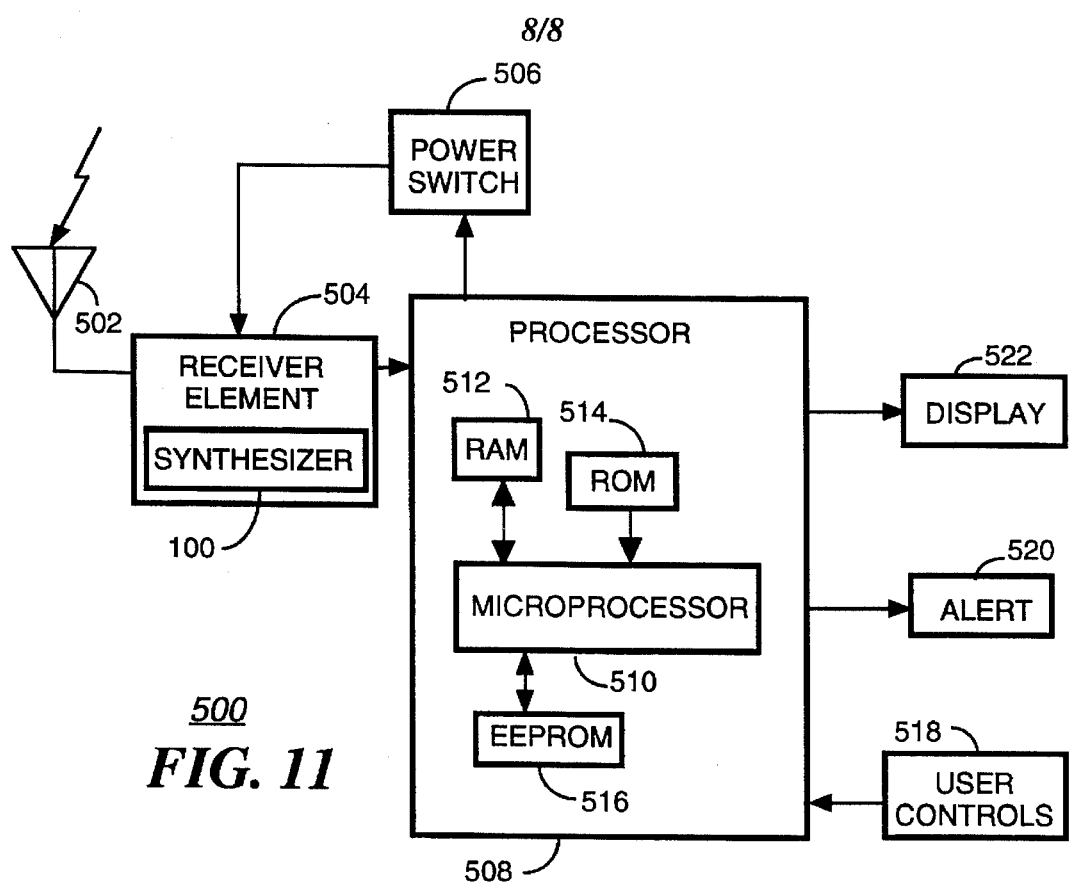
FIG. 11 is an electrical block diagram of a communication receiver in accordance with the preferred embodiment of the present invention.

FIG. 11 is an electrical block diagram of the communication receiver 500 in accordance with the preferred embodiment of the present invention. The communication receiver 500 includes a receiver antenna 502 for intercepting radio frequency (RF) signals comprising messages from a transmitting station (not shown). The receiver antenna 502 is coupled to a receiver element 504 applying conventional demodulation techniques for receiving the RF signals. The receiver element 504 includes the synthesizer 100 discussed above for generating the proper operation signals utilized by the demodulation circuits of the receiver element 504. Once the RF signals have been demodulated, the receiver element 504 generates demodulated message information which is presented to a processor 508 for processing. A conventional power switch 506, coupled to the processor 508, is used to control the supply of power to the receiver element 504, thereby providing a battery saving function.

To perform the necessary functions of the communication receiver 500, the processor 508 includes a microprocessor 510, a random access memory (RAM) 512, a read-only memory (ROM) 514, and an electrically erasable programmable read-only memory (EEPROM) 516.

Preferably, the microprocessor 510 is similar to the M68HC08 micro-controller manufactured by Motorola, Inc. It will be appreciated that other similar processors can be utilized for the microprocessor 510, and that additional processors of the same or alternative type can be added as required to handle the processing requirements of the processor 508. It will also be appreciated that other types of memory, e.g., EEPROM or FLASH, can be utilized for the ROM 514, as well as the RAM 512. It will be further appreciated that the RAM 512 and the ROM 514, singly or in combination, can be manufactured as an integral portion of the processor 508.

The processor 508 is programmed by way of the ROM 514 to process incoming messages transmitted by the transmitting station. During message processing, the processor 508 decodes in a conventional manner an address in the demodulated message information, compares the decoded address with one or more addresses stored in the EEPROM 516, and when a match is detected, the processor 508 proceeds to process the remaining portion of the message.

Once the processor 508 has processed the message, it stores the message in the RAM 512, and a call alerting signal is generated to alert a user that a message has been received. The call alerting signal is directed to a conventional audible or tactile alerting device 520 for generating an audible or tactile call alerting signal.

The message can be accessed by the user through user controls 518, which provide functions such as lock, unlock, delete, read, etc. More specifically, by the use of appropriate functions provided by the user controls 518, the message is recovered from the RAM 512, and then conveyed to the user by way of an information interface comprising a display 522 for displaying the message, e.g., a conventional liquid crystal display (LCD).

Thus, it should be apparent by now that the present invention provides a phase error detector and a phase lock loop that offers the advantages of both the analog and digital domains, without including the disadvantages of either domain. A phase error detector and a phase lock loop in accordance with the present invention provide the repeatability and sealability associated with the digital domain, with the freedom from quantization error and quantization noise associated with the analog domain.

What is claimed is:

1. A hybrid analog-digital phase error detector for detecting a phase error between first and second clock signals, the hybrid analog-digital phase error detector comprising:
   an analog phase error detector coupled to the first and second clock signals for generating an analog phase error signal starting at a first selected transition of the second clock signal and ending at a first selected transition of the first clock signal;

a digital phase error detector coupled to the first clock signal and the analog phase error signal for generating a digital phase error value starting at a second selected transition of the second clock signal and ending at a second selected transition of the first clock signal;

a digital controller coupled to the digital phase error detector for executing a digital control algorithm based on the digital phase error value to produce a digitally derived control signal;

an analog controller coupled to the analog phase error detector for executing an analog control algorithm based on the analog phase error signal to produce an analog control signal; and a summer coupled to the digital controller and coupled to the analog controller for combining the analog control signal and the digitally derived control signal to produce a composite control signal representing the phase error.

2. The hybrid analog-digital phase error detector of claim 1, wherein the digital controller comprises a digital to analog converter for generating the digitally derived control signal in an analog form, and wherein the summer is an analog summer.

3. The hybrid analog-digital phase error detector of claim 1, wherein the digital phase error detector comprises:

a digital counter coupled to the first clock signal for counting the first clock signal; and a register coupled to the digital counter and coupled to the analog phase error signal for storing a count value from the digital counter to produce the digital phase error value.

4. The hybrid analog-digital phase error detector of claim 3, wherein the first and second clock signals are intended to operate at a first frequency and a second frequency, respectively, and wherein the digital counter comprises K sequential states, and wherein K is an integer value equal to the first frequency divided by the second frequency.

5. The hybrid analog-digital phase error detector of claim 1, wherein the analog phase error detector comprises:

a reset generator;

a first flip-flop having a clock input coupled to the second clock signal, having a data input coupled to a binary "1" signal, having a non-inverting output coupled to a data input of a second flip-flop and coupled to a first input of the reset generator, having an inverting output coupled to a fourth input of the reset generator, and having an inverted reset input coupled to an output of the reset generator; and the second flip-flop having a clock input coupled to the first clock signal, having a non-inverting output coupled to a second input of the reset generator, having an inverting output coupled to a third input of the reset generator, and having an inverted reset input coupled to the output of the reset generator, wherein the non-inverting output of the first flip-flop generates a rectangular pulse having a width proportional to a time between the first selected transition of the second clock signal and the first selected transition of the first clock signal.

6. The hybrid analog-digital phase error detector of claim 5, wherein the reset generator comprises:

a first NAND gate, inputs thereof forming the first and second inputs of the reset generator;

a second NAND gate, inputs thereof forming the third and fourth inputs of the reset generator;

a third NAND gate, inputs thereof coupled, respectively, to an output of the first NAND gate and an output of a fourth NAND gate; and the fourth NAND gate, inputs thereof coupled respectively, to an output of the third NAND gate and an output of the second NAND gate, wherein the output of the fourth NAND gate forms the output of the reset generator.

7. A phase lock loop, comprising:

a controlled oscillator coupled to a composite control signal for generating a first clock signal responsive to the composite control signal; and a hybrid analog-digital phase error detector for detecting a phase error between the first clock signal and a second clock signal, the hybrid analog-digital phase error detector comprising:

an analog phase error detector coupled to the first and second clock signals for generating an analog phase error signal starting at a first selected transition of the second clock signal and ending at a first selected transition of the first clock signal;

a digital phase error detector coupled to the first clock signal and the analog phase error signal for generating a digital phase error value starting at a second selected transition of the second clock signal and ending at a second selected transition of the first clock signal;

a digital controller coupled to the digital phase error detector for executing a digital control algorithm based on the digital phase error value to produce a digitally derived control signal;

an analog controller coupled to the analog phase error detector for executing an analog control algorithm based on the analog phase error signal to produce an analog control signal; and a summer coupled to the digital controller and coupled to the analog controller for combining the analog control signal and the digitally derived control signal to produce a composite control signal representing the phase error.

8. The phase lock loop of claim 7, wherein the digital controller comprises a digital to analog converter for generating the digitally derived control signal in an analog form, and wherein the summer is an analog summer.

9. The phase lock loop of claim 7, wherein the digital phase error detector comprises:

a digital counter coupled to the first clock signal for counting the first clock signal; and a register coupled to the digital counter and coupled to the analog phase error signal for storing a count value from the digital counter to produce the digital phase error value.

10. The phase lock loop of claim 9, wherein the first and second clock signals are intended to operate at a first frequency and a second frequency, respectively, and wherein the digital counter comprises K sequential states, and wherein K is an integer value equal to the first frequency divided by the second frequency.

11. The phase lock loop of claim 7, wherein the analog phase error detector comprises:

a reset generator;

a first flip-flop having a clock input coupled to the second clock signal, having a data input coupled to a binary "1" signal, having a non-inverting output coupled to a data input of a second flip-flop and coupled to a first input of the reset generator, having an inverting output coupled to a fourth input of the reset generator, and having an inverted reset input coupled to an output of the reset generator; and the second flip-flop having a clock input coupled to the first clock signal, having a non-inverting output coupled to a second input of the reset generator, having an inverting output coupled to a third input of the reset generator, and having an inverted reset input coupled to the output of the reset generator, wherein the non-inverting output of the first flip-flop generates a rectangular pulse having a width proportional to a time between the first selected transition of the second clock signal and the first selected transition of the first clock signal.

12. The phase lock loop of claim 11, wherein the reset generator comprises:

a first NAND gate, inputs thereof forming the first and second inputs of the reset generator;

a second NAND gate, inputs thereof forming the third and fourth inputs of the reset generator;

a third NAND gate, inputs thereof coupled, respectively, to an output of the first NAND gate and an output of a fourth NAND gate; and the fourth NAND gate, inputs thereof coupled respectively, to an output of the third NAND gate and an output of the second NAND gate, wherein the output of the fourth NAND gate forms the output of the reset generator.

13. A communication receiver, comprising:

an antenna for intercepting a radio signal including a message;

a receiver element coupled to the antenna for demodulating the message;

a processor coupled to the receiver element for processing the message;

a user control coupled to the processor for providing control of the communication receiver by a user; and a display coupled to the processor for displaying the message, wherein the receiver element includes:

a reference oscillator for generating a second clock signal; and a phase lock loop, comprising:

a controlled oscillator coupled to a composite control signal for generating a first clock signal responsive to the composite control signal; and a hybrid analog-digital phase error detector for detecting a phase error between the first clock signal and the second clock signal, the hybrid analog-digital phase error detector comprising:

an analog phase error detector coupled to the first and second clock signals for generating an analog phase error signal starting at a first selected transition of the second clock signal and ending at a first selected transition of the first clock signal;

a digital phase error detector coupled to the first clock signal and the analog phase error signal for generating a digital phase error value starting at a second selected transition of the second clock signal and ending at a second selected transition of the first clock signal;

a digital controller coupled to the digital phase error detector for executing a digital control algorithm based on the digital phase error value to produce a digitally derived control signal;

an analog controller coupled to the analog phase error detector for executing an analog control algorithm based on the analog phase error signal to produce an analog control signal; and a summer coupled to the digital controller and coupled to the analog controller for combining the analog control signal and the digitally derived control signal to produce a composite control signal representing the phase error.

14. The communication receiver of claim 13, wherein the digital controller comprises a digital to analog converter for generating the digitally derived control signal in an analog form, and wherein the summer is an analog summer.

15. The phase lock loop of claim 13, wherein the digital phase error detector comprises:

a digital counter coupled to the first clock signal for counting the first clock signal; and a register coupled to the digital counter and coupled to the analog phase error signal for storing a count value from the digital counter to produce the digital phase error value.

16. The communication receiver of claim 15, wherein the first and second clock signals are intended to operate at a first frequency and a second frequency, respectively, and wherein the digital counter comprises K sequential states, and wherein K is an integer value equal to the first frequency divided by the second frequency.

17. The communication receiver of claim 13, wherein the analog phase error detector comprises:

a reset generator;

a first flip-flop having a clock input coupled to the second clock signal, having a data input coupled to a binary "1" signal, having a non-inverting output coupled to a data input of a second flip-flop and coupled to a first input of the reset generator, having an inverting output coupled to a fourth input of the reset generator, and having an inverted reset input coupled to an output of the reset generator; and the second flip-flop having a clock input coupled to the first clock signal, having a non-inverting output coupled to a second input of the reset generator, having an inverting output coupled to a third input of the reset generator, and having an inverted reset input coupled to the output of the reset generator, wherein the non-inverting output of the first flip-flop generates a rectangular pulse having a width proportional to a time between the first selected transition of the second clock signal and the first selected transition of the first clock signal.

18. The communication receiver of claim 17, wherein the reset generator comprises:

a first NAND gate, inputs thereof forming the first and second inputs of the reset generator;

a second NAND gate, inputs thereof forming the third and fourth inputs of the reset generator;

a third NAND gate, inputs thereof coupled, respectively, to an output of the first NAND gate and an output of a fourth NAND gate; and the fourth NAND gate, inputs thereof coupled respectively, to an output of the third NAND gate and an output of the second NAND gate, wherein the output of the fourth NAND gate forms the output of the reset generator.

* * * * *